United States Patent
Kishimura et al.

(10) Patent No.: US 6,806,029 B2
(45) Date of Patent: Oct. 19, 2004

(54) PATTERN FORMATION MATERIAL AND PATTERN FORMATION METHOD

(75) Inventors: Shinji Kishimura, Hyogo (JP); Masayuki Endo, Osaka (JP); Masaru Sasago, Osaka (JP); Mitsuru Ueda, Tokyo (JP); Tsuyohiko Fujigaya, Saitama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 19 days.

(21) Appl. No.: 10/235,945

(22) Filed: Sep. 6, 2002

(65) Prior Publication Data

US 2003/0087184 A1 May 8, 2003

(30) Foreign Application Priority Data

Sep. 13, 2001 (JP) .................................. 2001-277592

(51) Int. Cl.⁷ .............................. G03F 7/004; G03F 7/00
(52) U.S. Cl. ................ 430/270.1; 430/905; 430/907; 525/219; 525/210; 526/346
(58) Field of Search .............................. 430/270.1, 905, 430/909, 907, 966; 526/346; 525/219, 210

(56) References Cited

PUBLICATIONS

Fujigaya et al., "New photoresist materials for 157 nm lithography", Chemical Materials, 2003, 15, 1512–1517.*
Ando et al., "DFT Calculations of photoabsorption spectra in the VUV region for design of photoresist materials for 157 nm lithography", Journal of Photopolymer Science and Technology, vol. 15, No. 4, 2002, 231–236.*
Fujigaya et al., "New photoresist material for 157 nm lithography", Polymeric Materials: Science & Engineering 2002, 86, 148–149.*
Kishimura et al., "Dissolution Characteristics of Acidic Groups for 157 nm Resist", Journal of Photopolymer Science and Technology, vol. 15, No. 4, 2002, 625–628.*

* cited by examiner

Primary Examiner—Yvette C. Thornton
(74) Attorney, Agent, or Firm—McDermott Will & Emery LLP

(57) ABSTRACT

A pattern formation material of this invention contains a base polymer including a first unit represented by Chemical Formula 1 and a second unit represented by Chemical Formula 2, and an acid generator:

[Chemical Formula 1]

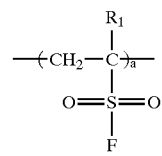

[Chemical formula 2]

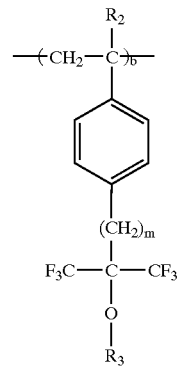

wherein $R_1$ and $R_2$ are the same or different and selected from the group consisting of a hydrogen atom, a chlorine atom, a fluorine atom, an alkyl group and an alkyl group including a fluorine atom;

$R_3$ is a protecting group released by an acid;

m is an integer of 0 through 5; and a and b satisfy $0<a<1, 0<b<1$ and $0<a+b \leq 1$.

28 Claims, 2 Drawing Sheets

(b)

(a)

(b)

(c)

(d)

(a)

(b)

(c)

(d)

PATTERN FORMATION MATERIAL AND PATTERN FORMATION METHOD

BACKGROUND OF THE INVENTION

The present invention relates to a pattern formation method and a pattern formation material, and more particularly, it relates to a pattern formation method for forming a resist pattern, used for forming a semiconductor device or a semiconductor integrated circuit on a semiconductor substrate, by using exposing light of a wavelength not longer than a 180 nm band and a pattern formation material used in the pattern formation method.

Currently, in fabrication of a mass storage semiconductor integrated circuit, such as a 64 Mbit dynamic random access memory (DRAM) and a logic device or a system LSI with a 0.25 μm through 0.15 μm rule, a resist pattern is formed by using a chemically amplified resist material including a polyhydroxystyrene derivative and an acid generator as principal constituents with KrF excimer laser (of a wavelength of a 248 nm band) used as exposing light.

Moreover, for fabrication of a 256 Mbit DRAM, a 1 Gbit DRAM or a system LSI with a 0.15 μm through 0.13 μm rule, a pattern formation method using, as exposing light, ArF excimer laser lasing at a shorter wavelength (of a 193 nm band) than the KrF excimer laser is now under development.

The chemically amplified resist material including a polyhydroxystyrene derivative as a principal constituent has high absorbance against light of a wavelength of a 193 nm band because of an aromatic ring included therein. Therefore, exposing light of a wavelength of a 193 nm band cannot uniformly reach the bottom of a resist film, and hence, a pattern cannot be formed in a good shape. Accordingly, the chemically amplified resist material including a polyhydroxystyrene derivative as a principal constituent cannot be used when the ArF excimer laser is used as the exposing light.

Therefore, a chemically amplified resist material including, as a principal constituent, a polyacrylic acid derivative or a polycycloolefin derivative having no aromatic ring is used when the ArF excimer laser is used as the exposing light.

On the other hand, as exposing light for a pattern formation method capable of coping with high resolution, an electron beam (EB) and the like are being examined.

When the EB is used as the exposing light, however, the throughput is disadvantageously low, and hence, the EB is not suitable to mass production. Thus, the EB is not preferred as the exposing light.

Accordingly, in order to form a resist pattern finer than 0.10 μm, it is necessary to use exposing light of a wavelength shorter than that of the ArF excimer laser, such as $Xe_2$ laser (of a wavelength of a 172 nm band), $F_2$ laser (of a wavelength of a 157 nm band), $Kr_2$ laser (of a wavelength of a 146 nm band), ArKr laser (of a wavelength of a 134 nm band), $Ar_2$ laser (of a wavelength of a 126 nm band), soft X-rays (of a wavelength of a 13, 11 or 5 nm band) and hard X-rays (of a wavelength not longer than a 1 nm band). In other words, a resist pattern is required to be formed by using exposing light of a wavelength not longer than a 180 nm band.

Therefore, the present inventors have formed resist patterns by conducting pattern exposure using $F_2$ laser (of a wavelength of a 157 nm band) on resist films formed from conventionally known chemically amplified resist materials respectively including a polyhydroxystyrene derivative represented by Chemical Formula A, a polyacrylic acid derivative represented by Chemical Formula B and a polycycloolefin derivative represented by Chemical Formula C.

Chemical Formula A:

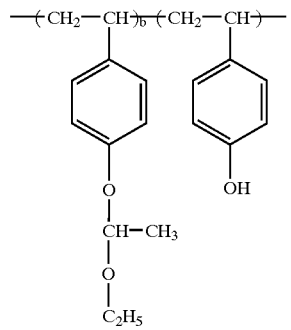

Chemical Formula B:

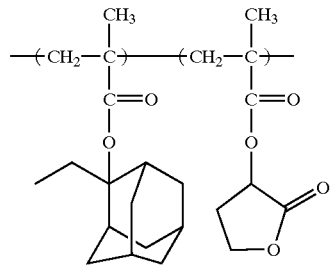

Chemical Formula C:

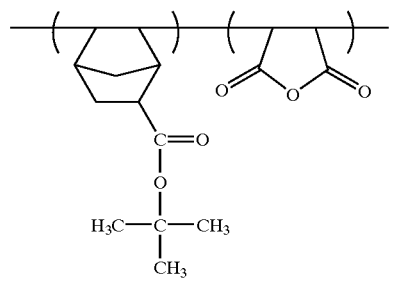

Now, a method for forming a resist pattern by using any of the aforementioned conventional chemically amplified resist materials and problems arising in the conventional method will be described with reference to FIGS. 2A through 2D.

First, as shown in FIG. 2A, the chemically amplified resist material is applied on a semiconductor substrate 1 by spin coating and the resultant is heated, so as to form a resist film 2 with a thickness of 0.3 μm. Thereafter, as shown in FIG. 2B, the resist film 2 is irradiated with a $F_2$ laser beam 4 through a mask 3 for pattern exposure. Thus, an acid is generated from the acid generator in an exposed portion 2a of the resist film 2 while no acid is generated in an unexposed portion 2b of the resist film 2.

Next, as shown in FIG. 2C, the semiconductor substrate 1 is heated with a hot plate 5 at, for example 100° C. for 60 seconds.

Then, the resist film 2 is developed with an alkaline developer, thereby forming a resist pattern 6 as shown in FIG. 2D.

However, as shown in FIG. 2D, the resist pattern 6 cannot be formed in a good pattern shape, and there remains much scum on the semiconductor substrate 1. Such problems occur not only in using the $F_2$ laser beam as the exposing light but also in using any of the other light of a wavelength not longer than a 180 nm band.

Accordingly, a resist pattern cannot be practically formed by irradiating a resist film formed from any of the aforementioned chemically amplified resist materials with light of a wavelength not longer than a 180 nm band.

SUMMARY OF THE INVENTION

In consideration of the aforementioned conventional problems, an object of the invention is forming a resist pattern in a good pattern shape by using exposing light of a wavelength not longer than a 180 nm band with minimally producing scum.

The present inventors have studied the cause of the conventional problems occurring in using the conventional chemically amplified resist materials and have found the following:

First, the chemically amplified resist materials have high absorbance against light of a wavelength not longer than a 180 nm band. For example, a resist film with a thickness of 100 nm formed from the chemically amplified resist material including a polyhydroxystyrene derivative has transmittance of 20% at most against a $F_2$ laser beam (of a wavelength of a 157 nm band).

Therefore, various examination has been made on means for improving the transmittance of a chemically amplified resist material against light of a wavelength not longer than a 180 nm band. As a result, it has been found that a unit represented by Chemical Formula 1 below and a unit represented by Chemical Formula 2 below can improve the transmittance against light of a wavelength not longer than a 180 nm band.

The present invention was devised on the basis of the aforementioned finding, and specifically provides pattern formation materials and methods described below.

The first pattern formation material of this invention comprises a base polymer including a first unit represented by Chemical Formula 1 and a second unit represented by Chemical Formula 2; and an acid generator:

Chemical Formula 1:

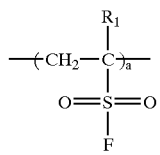

Chemical Formula 2:

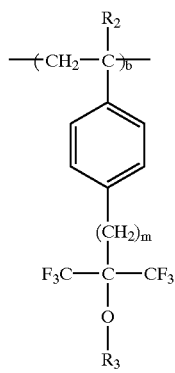

wherein $R_1$ and $R_2$ are the same or different and selected from the group consisting of a hydrogen atom, a chlorine atom, a fluorine atom, an alkyl group and an alkyl group including a fluorine atom; $R_3$ is a protecting group released by an acid; m is an integer of 0 through 5; and a and b satisfy $0<a<1, 0<b<1$ and $0<a+b\leq 1$.

Since the base polymer of the first pattern formation material includes the first and second units respectively represented by Chemical Formulas 1 and 2, the transmittance of a resist film against light of a wavelength not longer than a 180 nm band can be improved. Also, since $R_3$ is released from the second unit owing to the function of an acid so as to generate hexafluoroisopropyl alcohol, the solubility in a developer of an exposed portion of the resist film can be improved. Therefore, the contrast in the solubility between the exposed portion and an unexposed portion of the resist film can be improved, and the wettability of the resist film is improved so as to improve adhesion between the resist film and a substrate. Furthermore, since the second unit has a benzene ring, resistance against dry etching can be improved.

In the first pattern formation material, the base polymer can be prepared through radical polymerization of the first unit and the second unit.

Alternatively, in the first pattern formation material, the base polymer can be prepared by obtaining a polymer through radical polymerization of the first unit and a precursor obtained before substituting $R_3$ for the second unit and allowing $R_3$ to bond to the precursor included in the polymer.

The second pattern formation material of this invention comprises a base polymer including a first unit represented by Chemical Formula 1, a second unit represented by Chemical Formula 2 and a third unit represented by Chemical Formula 3; and an acid generator:

Chemical Formula 1:

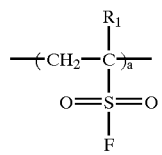

Chemical Formula 2:

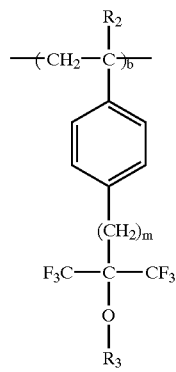

Chemical Formula 3:

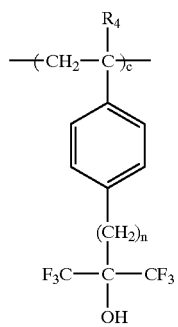

wherein $R_1$, $R_2$ and $R_4$ are the same or different and selected from the group consisting of a hydrogen atom, a chlorine atom, a fluorine atom, an alkyl group and an alkyl group including a fluorine atom; $R_3$ is a protecting group released by an acid; m and n are integers of 0 through 5; and a, b and c satisfy $0<a<1, 0<b<1, 0<c<1$ and $0<a+b+c\leq 1$.

Since the base polymer of the second pattern formation material includes the first through third units respectively represented by Chemical Formulas 1 through 3, the transmittance of a resist film against light of a wavelength not longer than a 180 nm band can be largely improved. Also, $R_3$ is released from the second unit owing to the function of an acid so as to generate hexafluoroisopropyl alcohol and the third unit has hexafluoroisopropyl alcohol. Therefore, the solubility in a developer of an exposed portion of the resist film can be improved so as to largely improve the contrast in solubility between the exposed portion and an unexposed portion of the resist film, and the wettability of the resist film can be improved so as to largely improve the adhesion between the resist film and a substrate. Furthermore, since the second unit and the third unit respectively have benzene rings, the resistance against dry etching can be largely improved.

In the second pattern formation material, the base polymer can be prepared through radical polymerization of the first unit, the second unit and the third unit.

Alternatively, in the second pattern formation material, the base polymer can be prepared by obtaining a polymer through radical polymerization of the first unit and the third unit and substituting $R_3$ for some of H of OH groups of the third unit included in the polymer.

The third pattern formation material of this invention comprises a base polymer including a first unit represented by Chemical Formula 1 and a second unit represented by Chemical Formula 4; and an acid generator:

Chemical Formula 1:

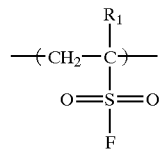

Chemical Formula 4:

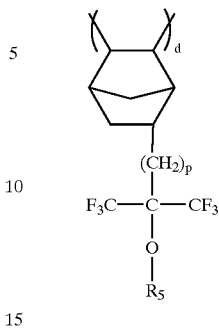

wherein $R_1$ is a hydrogen atom, a chlorine atom, a fluorine atom, an alkyl group or an alkyl group including a fluorine atom; $R_5$ is a protecting group released by an acid; p is an integer of 0 through 5; and a and d satisfy $0<a<1, 0<d<1$ and $0<a+d\leq 1$.

Since the base polymer of the third pattern formation material includes the first and second units, the transmittance of a resist film against light of a wavelength not longer than a 180 nm band can be improved. In particular, since the second unit has a norbornene ring, the transmittance of the resist film against light of a wavelength not longer than a 180 nm band can be further improved than that attained by the first pattern formation material. Also, since $R_5$ is released from the second unit owing to the function of an acid so as to generate hexafluoroisopropyl alcohol, the solubility in a developer of an exposed portion of the resist film can be improved. Therefore, the contrast in the solubility between the exposed portion and an unexposed portion of the resist film can be improved, and the wettability of the resist film can be improved so as to improve the adhesion between the resist film and a substrate. Furthermore, since the second unit has a norbornene ring, the resistance against dry etching can be improved.

In the third pattern formation material, the base polymer can be prepared through radical polymerization of the first unit and the second unit.

Alternatively, in the third pattern formation material, the base polymer can be prepared by obtaining a polymer through radical polymerization of the first unit and a precursor obtained before substituting $R_5$ for the second unit and allowing $R_5$ to bond to the precursor included in the polymer.

The fourth pattern formation material of this invention comprises a base polymer including a first unit represented by Chemical Formula 1, a second unit represented by Chemical Formula 4 and a third unit represented by Chemical Formula 5; and an acid generator:

Chemical Formula 1:

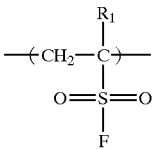

Chemical Formula 4:

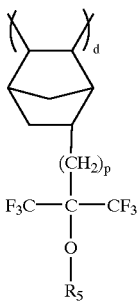

Chemical Formula 5:

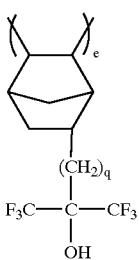

wherein $R_1$ is a hydrogen atom, a chlorine atom, a fluorine atom, an alkyl group or an alkyl group including a fluorine atom; $R_5$ is a protecting group released by an acid; p and q are integers of 0 through 5; and a, d and e satisfy $0<a<1$, $0<d<1, 0<e<1$ and $0<a+d+e \leq 1$.

Since the base polymer of the fourth pattern formation material includes the first through third units, the transmittance of a resist film against light of a wavelength not longer than a 180 nm band can be largely improved. In particular, since the second unit and the third unit respectively have norbornene rings, the transmittance of the resist film against light of a wavelength not longer than a 180 nm band can be further improved than that attained by the second pattern formation material. Also, $R_5$ is released from the second unit owing to the function of an acid so as to generate hexafluoroisopropyl alcohol and the third unit has hexafluoroisopropyl alcohol. Therefore, the solubility in a developer of an exposed portion of the resist film can be improved so as to largely improve the contrast in the solubility between the exposed portion and an unexposed portion of the resist film, and the wettability of the resist film can be improved so as to largely improve the adhesion between the resist film and a substrate. Furthermore, since the second unit and the third unit respectively have norbornene rings, the resistance against dry etching can be largely improved.

The first pattern formation method of this invention comprises the steps of forming a resist film by applying the first pattern formation material on a substrate; irradiating the resist film with exposing light of a wavelength not longer than a 180 nm band for pattern exposure; and forming a resist pattern by developing the resist film after the pattern exposure.

Since the first pattern formation material is used in the first pattern formation method, the transmittance of the resist film against light of a wavelength not longer than a 180 nm band can be improved, the contrast in the solubility between an exposed portion and an unexposed portion of the resist film can be improved, the adhesion between the resist film and the substrate can be improved, and the resistance against dry etching can be improved.

The second pattern formation method of this invention comprises the steps of forming a resist film by applying the second pattern formation material on a substrate; irradiating the resist film with exposing light of a wavelength not longer than a 180 nm band for pattern exposure; and forming a resist pattern by developing the resist film after the pattern exposure.

Since the second pattern formation material is used in the second pattern formation method, the transmittance of the resist film against light of a wavelength not longer than a 180 nm band can be largely improved, the contrast in the solubility between an exposed portion and an unexposed portion of the resist film can be largely improved, the adhesion between the resist film and the substrate can be largely improved, and the resistance against dry etching can be largely improved.

The third pattern formation method of this invention comprises the steps of forming a resist film by applying the third pattern formation material on a substrate; irradiating the resist film with exposing light of a wavelength not longer than a 180 nm band for pattern exposure; and forming a resist pattern by developing the resist film after the pattern exposure.

Since the third pattern formation material is used in the third pattern formation method, the transmittance of the resist film against light of a wavelength not longer than a 180 nm band can be further improved, the contrast in the solubility between an exposed portion and an unexposed portion of the resist film can be improved, the adhesion between the resist film and the substrate can be improved, and the resistance against dry etching can be improved.

The fourth pattern formation method of this invention comprises the steps of forming a resist film by applying the fourth pattern formation material on a substrate; irradiating the resist film with exposing light of a wavelength not longer than a 180 nm band for pattern exposure; and forming a resist pattern by developing the resist film after the pattern exposure.

Since the fourth pattern formation material is used in the fourth pattern formation method, the transmittance of the resist film against light of a wavelength not longer than a 180 nm band can be further largely improved, the contrast in the solubility between an exposed portion and an unexposed portion of the resist film can be largely improved, the adhesion between the resist film and the substrate can be largely improved, and the resistance against dry etching can be largely improved.

In any of the first through fourth pattern formation methods, the exposing light may be light of a wavelength of a 110 through 180 nm band, such as a $Xe_2$ laser beam, a $F_2$ laser beam, a $Kr_2$ laser beam, an ArKr laser beam or an $Ar_2$ laser beam, a soft X-ray beam of a wavelength of a 1 through 30 nm band, or a hard X-ray beam of a wavelength not longer than a 1 nm band.

DETAILED DESCRIPTION OF THE INVENTION

Embodiment 1

Figure 1:
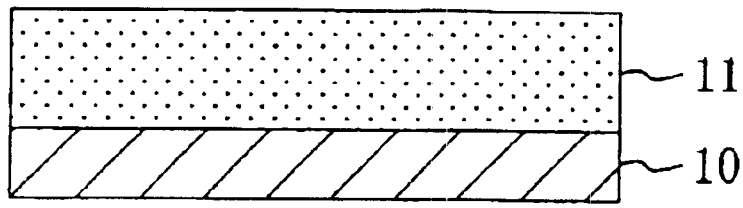
FIGS. 1A, 1B, 1C and 1D are cross-sectional views for showing procedures in a pattern formation method according to any of Embodiments 1 through 4 of the invention.
Figure 1:
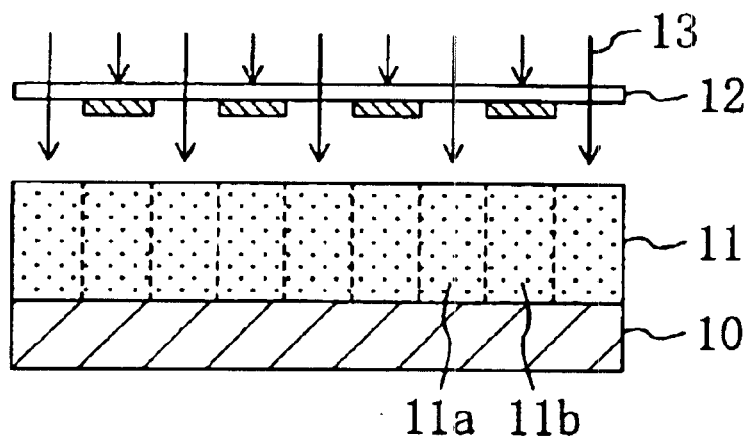
Figure 1:
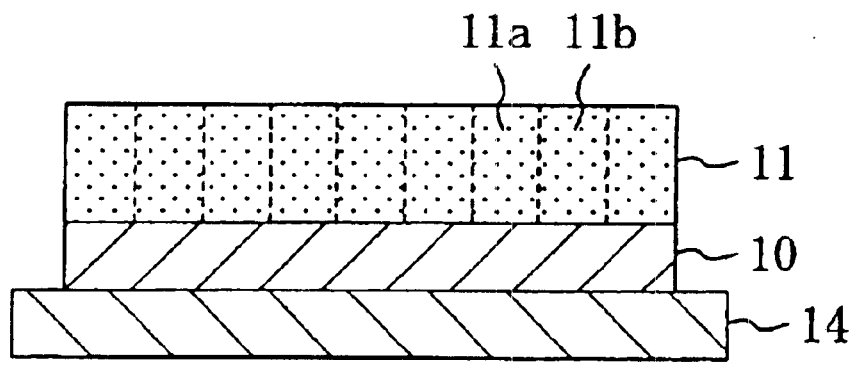
Figure 1:
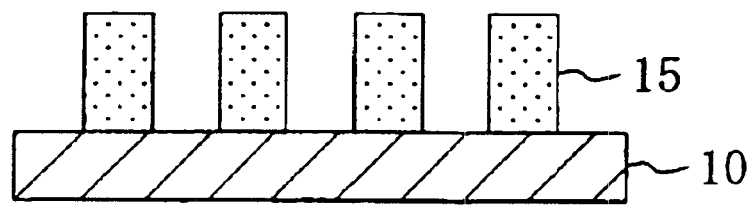
Figure 2:
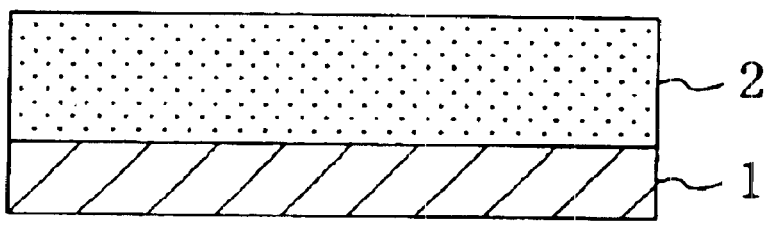
FIGS. 2A, 2B, 2C and 2D are cross-sectional views for showing procedures in a conventional pattern formation method.
Figure 2:
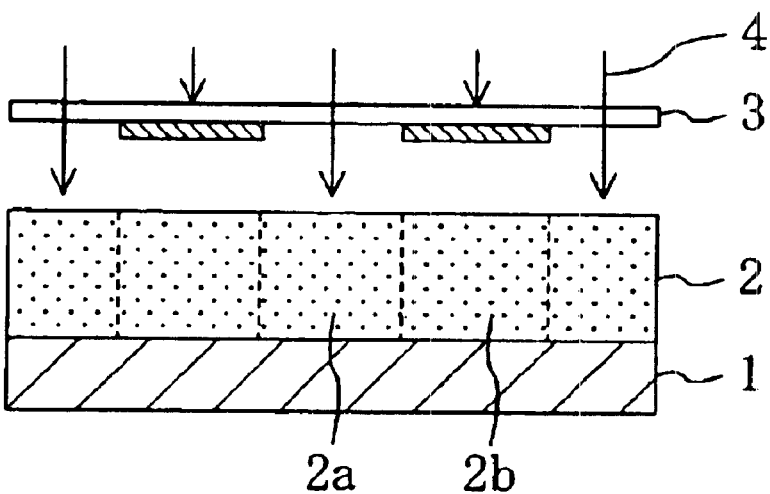
Figure 2:
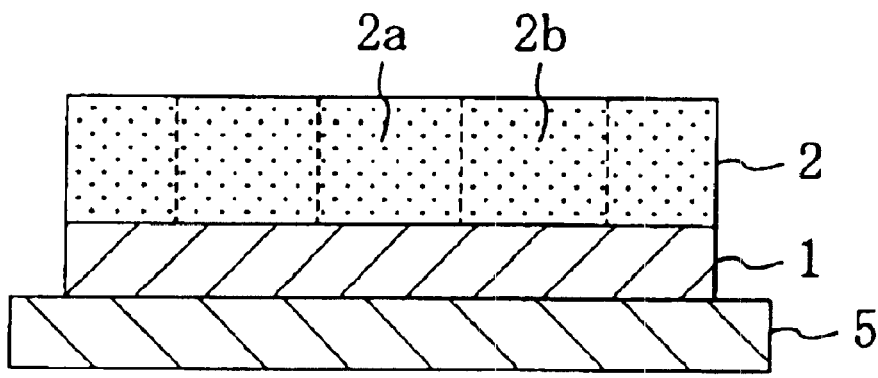
Figure 2:
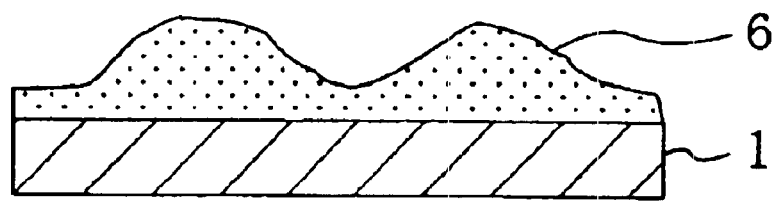

A pattern formation material and a pattern formation method according to Embodiment 1 of the invention will now be described.

In this embodiment, the first pattern formation material and the first pattern formation method described above are embodied, and the specific composition of a resist material of this embodiment is as follows:

Base polymer: a polymer represented by Chemical Formula 6 below

Acid generator: triphenylsulfonium triflate (5 wt % based on the base polymer)

Solvent: propylene glycol monomethyl ether acetate

Chemical Formula 6:

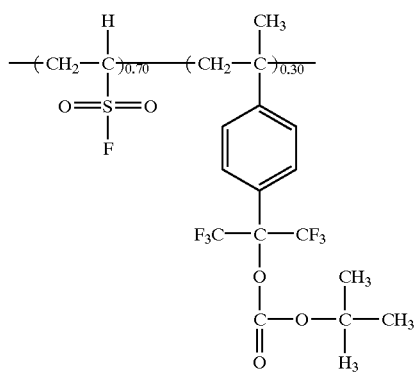

Chemical Formula 6 represents a specific example of a base polymer including the above-described first and second units respectively represented by Chemical Formulas 1 and 2.

In the first unit and the second unit, $R_1$ and $R_2$ may be the same or different and selected from the group consisting of a hydrogen atom, a chlorine atom, a fluorine atom, an alkyl group and an alkyl group including a fluorine atom.

In the second unit, $R_3$ may be any of protecting groups represented by Chemical Formula 7 below:

Chemical Formula 7:

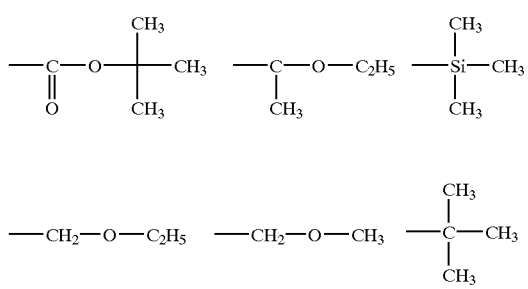

Although m is 0 in the second unit, m may be an integer of 1 through 5 instead.

Now, a first synthesis method for the base polymer of the first pattern formation material will be described with reference to Chemical Formula 8 below.

Chemical Formula 8:

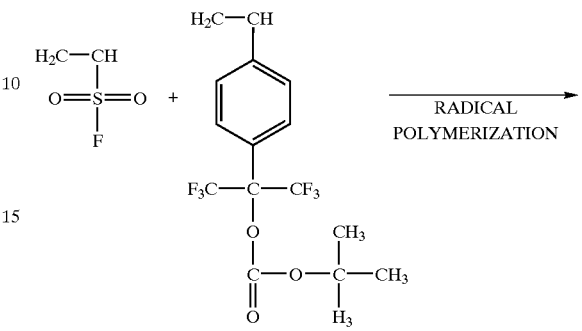

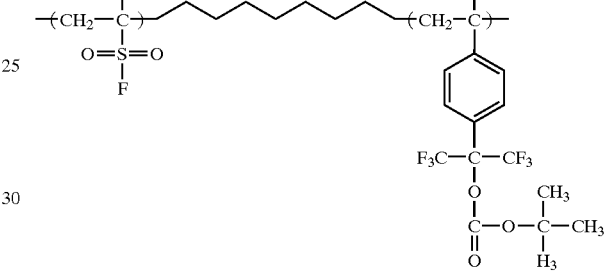

As represented by Chemical Formula 8, the base polymer of the first pattern formation material is prepared through radical polymerization of the first unit represented by Chemical Formula 1 and the second unit represented by Chemical Formula 2. In this case, the first unit and the second unit can be easily radical polymerized.

Next, a second synthesis method for the base polymer of the first pattern formation material will be described with reference to Chemical Formula 9 below.

Chemical Formula 9:

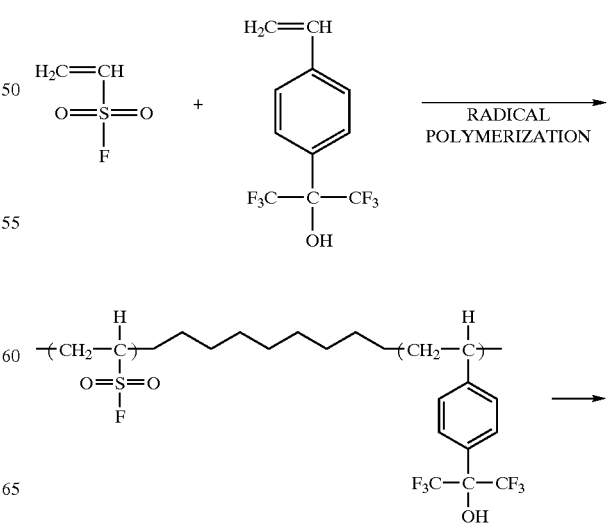

-continued

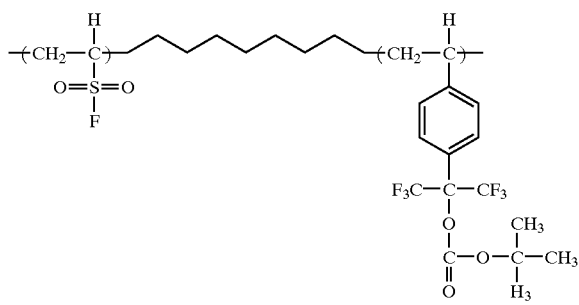

After placing AIBN (α,α-azobis(isobutyronitrile)) serving as a catalyst in a polymerization tube, 0.22 g (2 mmol) of vinyl sulfonyl fluoride ($SO_2F$) (corresponding to the first unit) and 0.54 g (2 mmol) of 4-(1,1,1,3,3,3-hexafluoro-2-hydroxypropyl)styrene (HFISt) (corresponding to a precursor obtained before substituting $R_3$ for the second unit), both of which are separately synthesized in syringes, and toluene are introduced into the polymerization tube.

Then, the resultant is sufficiently freeze deaerated, and the polymerization tube is sealed and heated, so as to cause radical polymerization of the first unit and the precursor. In this case, the first unit and the precursor can be easily radical polymerized.

After completing the polymerization reaction, the polymerization tube is unsealed and the toluene is removed with an evaporator. Next, the thus obtained polymer is dissolved in acetone, and the resultant is precipitated in hexane again. The thus obtained solid is heated under reduced pressure and sufficiently dried, and the resultant solid is dissolved in acetone again and precipitated in distilled water. The thus obtained white solid is dried, so as to give a $SO_2F$-HFISt polymer.

Now, the pattern formation method of Embodiment 1 will be described with reference to FIGS. 1A through 1D.

First, as shown in FIG. 1A, the resist material having the above-described composition is applied on a semiconductor substrate 10 by spin coating, thereby forming a resist film 11 with a thickness of 0.2 μm. At this point, since the base polymer is alkali-refractory, the resist film 11 is alkali-refractory.

Next, as shown in FIG. 1B, the resist film 11 is subjected to pattern exposure by irradiating through a mask 12 with $F_2$ excimer laser 13 (of a wavelength of a 157 nm band). Thus, an acid is generated from the acid generator in an exposed portion 11a of the resist film 11 while no acid is generated in an unexposed portion 11b of the resist film 11.

Then, as shown in FIG. 1C, the semiconductor substrate 10 together with the resist film 11 is heated with a hot plate 14. Thus, the base polymer is heated in the presence of the acid in the exposed portion 11a of the resist film 11, so as to release a protecting group from the unit of Chemical Formula 2. As a result, the base polymer becomes alkali-soluble.

Subsequently, the resist film 11 is developed with an alkaline developer such as a tetramethylammonium hydroxide aqueous solution. Thus, the exposed portion 11a of the resist film 11 is dissolved in the developer, so that a resist pattern 15 can be formed from the unexposed portion 11b of the resist film 11 as shown in FIG. 1D.

Embodiment 2

A pattern formation material and a pattern formation method according to Embodiment 2 of the invention will now be described. Embodiment 2 is different from Embodiment 1 in the resist material alone, and hence, the resist material alone will be herein described.

In this embodiment, the second pattern formation material and the second pattern formation method described above are embodied, and the specific composition of the resist material is as follows:

Base polymer: a polymer represented by Chemical Formula 10 below

Acid generator: triphenylsulfonium triflate (5 wt % based on the base polymer)

Solvent: propylene glycol monomethyl ether acetate

Chemical Formula 10:

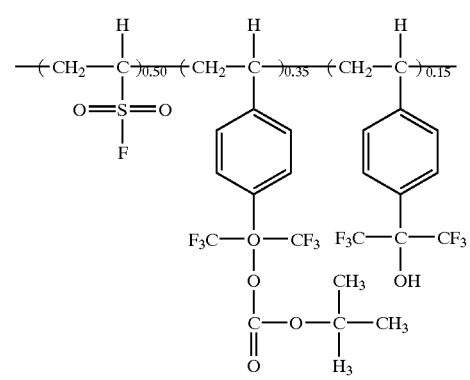

Chemical Formula 10 represents a specific example of a base polymer including the above-described first through third units respectively represented by Chemical Formulas 1 through 3.

In the first, second and third units, $R_1$, $R_2$ and $R_4$ may be the same or different and selected from the group consisting of a hydrogen atom, a chlorine atom, a fluorine atom, an alkyl group and an alkyl group including a fluorine atom.

In the second unit, $R_3$ may be, for example, any of the protecting groups represented by Chemical Formula 7.

Although m is 0 in the second unit, m may be an integer of 1 through 5 instead.

Also, although n is 0 in the third unit, n may be an integer of 1 through 5 instead.

Now, a first synthesis method for the base polymer of the second pattern formation material will be described with reference to Chemical Formula 11 below.

Chemical Formula 11:

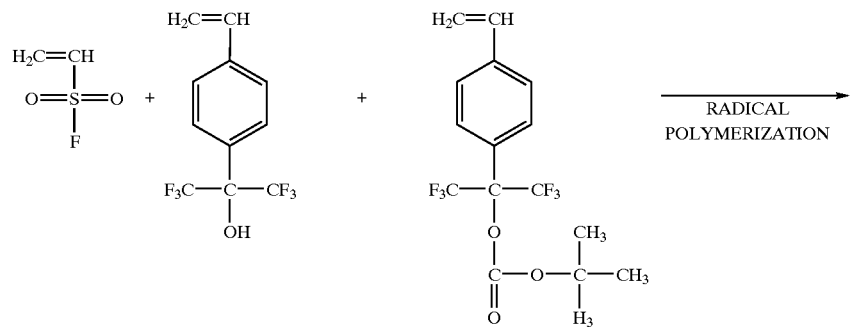

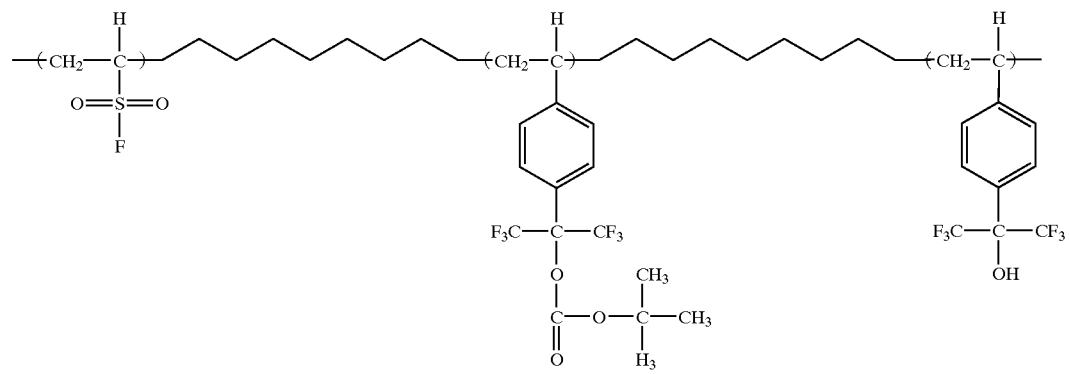

As represented by Chemical Formula 11, the base polymer of the second pattern formation material is obtained through the radical polymerization of the first unit represented by Chemical Formula 1, the second unit represented by Chemical Formula 2 and the third unit represented by Chemical Formula 3. In this case, the first unit, the second unit and the third unit can be easily radical polymerized.

Next, a second synthesis method for the base polymer of the second pattern formation material will be described with reference to Chemical Formula 12 below.

Chemical Formula 12:

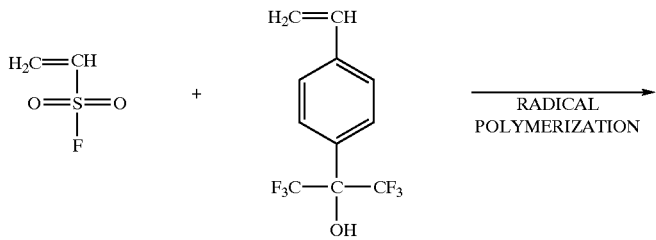

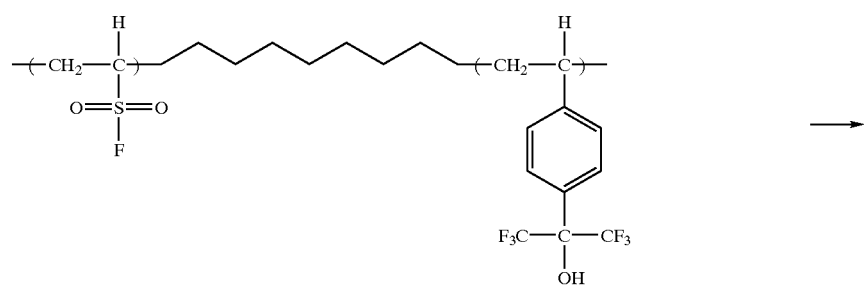

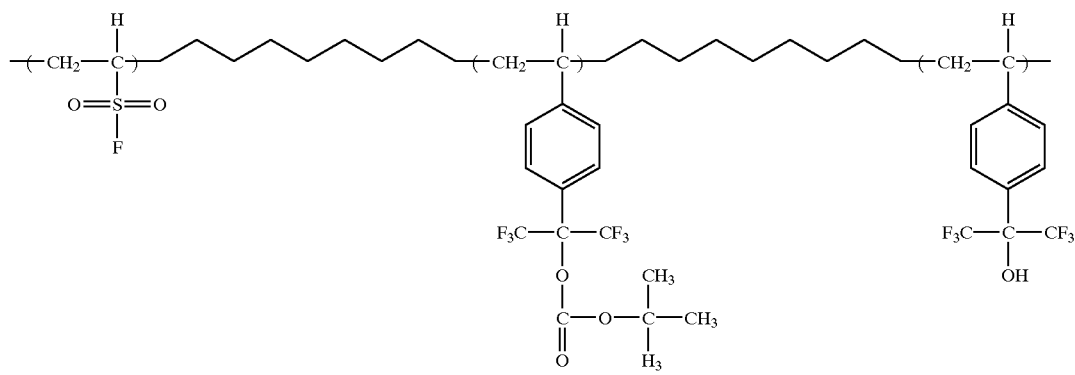

As represented by Chemical Formula 12, a copolymer is obtained through the radical polymerization of the first unit and the third unit, and $R_3$ is substituted for some of H of OH groups of the third unit included in the copolymer. In this case, the first unit and the third can be easily radical polymerized.

Embodiment 3

A pattern formation material and a pattern formation method according to Embodiment 3 of the invention will now be described. Embodiment 3 is different from Embodiment 1 in the resist material alone, and hence, the resist material alone will be herein described.

In this embodiment, the third pattern formation material and the third pattern formation method described above are embodied, and the specific composition of the resist material is as follows:

Base polymer: a polymer represented by Chemical Formula 13 below

Acid generator: triphenylsulfonium triflate (5 wt % based on the base polymer)

Solvent: propylene glycol monomethyl ether acetate

Chemical Formula 13:

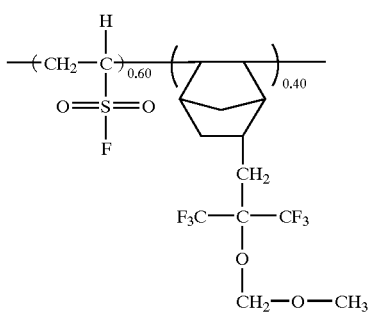

Chemical Formula 13 represents a specific example of a base polymer including the above-described first and second units respectively represented by Chemical Formulas 1 and 4.

In the first unit, $R_1$ is a hydrogen atom, and may be a chlorine atom, a fluorine atom, an alkyl group or an alkyl group including a fluorine group instead.

In the second unit, $R_5$ may be, for example, any of the protecting groups represented by Chemical Formula 7.

Also, although p is 1 in the second unit, p may be 0 or an integer of 2 through 5 instead.

Now, a first synthesis method for the base polymer of the third pattern formation material will be described with reference to Chemical Formula 14 below.

Chemical Formula 14:

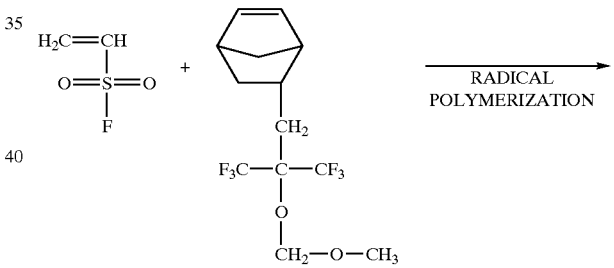

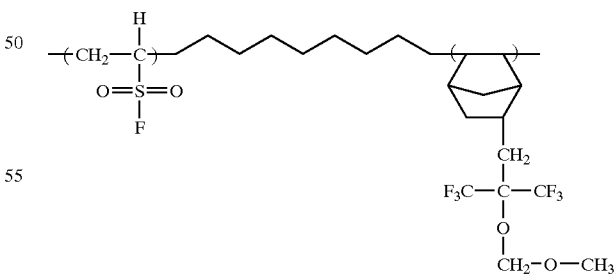

As represented by Chemical Formula 14, the base polymer of the third pattern formation material is obtained through the radical polymerization of the first unit represented by Chemical Formula 1 and the second unit represented by Chemical Formula 4. In this case, the first unit and the second unit can be easily radical polymerized.

Next, a second synthesis method for the base polymer of the third pattern formation material will be described with reference to Chemical Formula 15 below.

Chemical Formula 15:

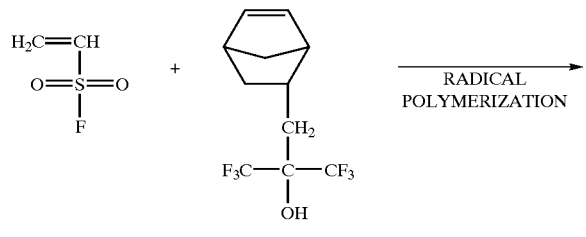

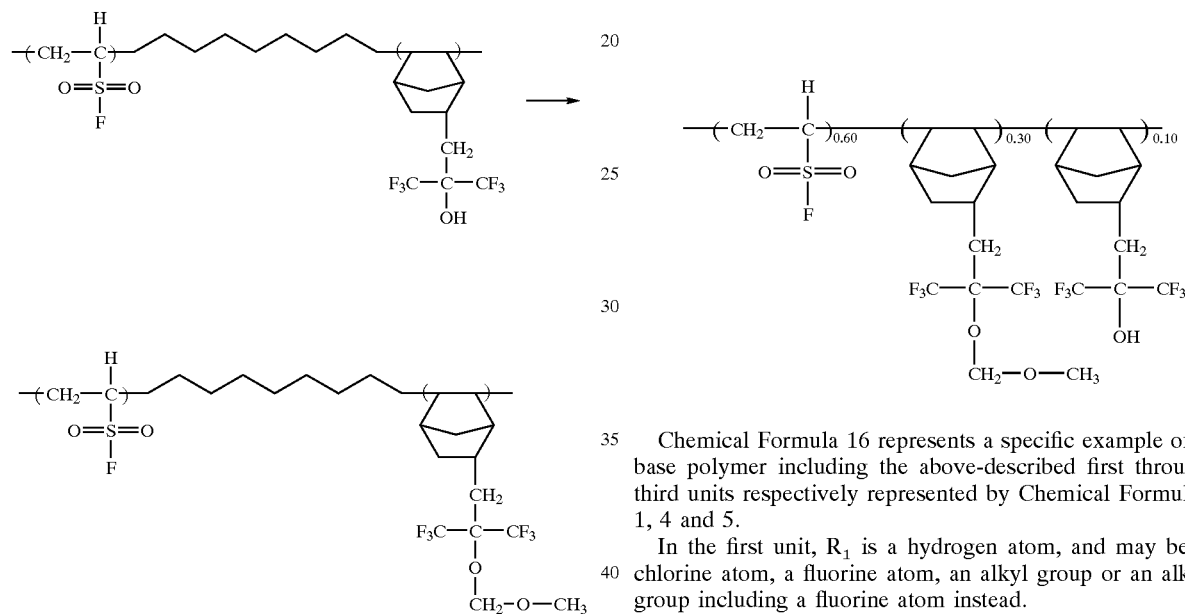

As represented by Chemical Formula 15, a copolymer is obtained through the radical polymerization of the first unit represented by Chemical Formula 1 and a precursor obtained before substituting $R_5$ for the second unit represented by Chemical Formula 4, and $R_5$ is allowed to bond to the precursor included in the copolymer. In this case, the first unit and the precursor can be easily radical polymerized.

Embodiment 4

A pattern formation material and a pattern formation method according to Embodiment 4 of the invention will now be described. Embodiment 4 is different from Embodiment 1 in the resist material alone, and hence, the resist material alone will be herein described.

In this embodiment, the fourth pattern formation material and the fourth pattern formation method described above are embodied, and the specific composition of the resist material is as follows:

Base polymer: a polymer represented by Chemical Formula 16 below

Acid generator: triphenylsulfonium triflate (5 wt % based on the base polymer)

Solvent: propylene glycol monomethyl ether acetate

Chemical Formula 16:

Chemical Formula 16 represents a specific example of a base polymer including the above-described first through third units respectively represented by Chemical Formulas 1, 4 and 5.

In the first unit, $R_1$ is a hydrogen atom, and may be a chlorine atom, a fluorine atom, an alkyl group or an alkyl group including a fluorine atom instead.

In the second unit, $R_5$ may be, for example, any of the protecting groups represented by Chemical Formula 7.

Also, although p is 1 in the second unit, p may be 0 or an integer of 2 through 5 instead.

Although q is 1 in the third unit, q may be 0 or an integer of 2 through 5 instead.

A first synthesis method for the base polymer of the fourth pattern formation material will be described with reference to Chemical Formula 17 below.

Chemical Formula 17:

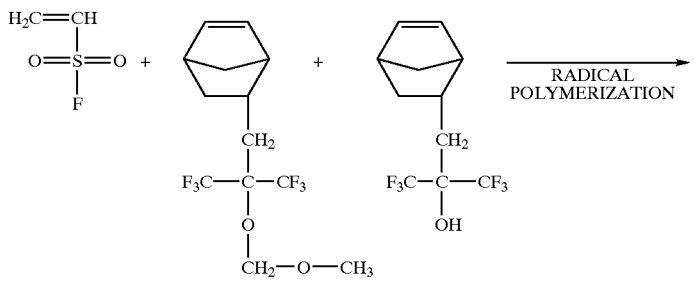

-continued

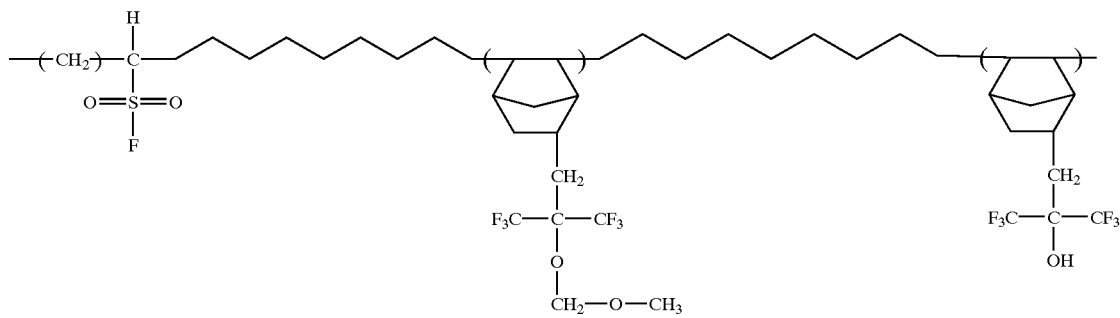

As represented by Chemical Formula 17, the base polymer of the fourth pattern formation material is obtained through the radical polymerization of the first unit represented by Chemical Formula 1, the second unit represented by Chemical Formula 4 and the third unit represented by Chemical Formula 5. In this case, the first unit, the second unit and the third unit can be easily radical polymerized.

Next, a second synthesis method for the base polymer of the fourth pattern formation material will be described with reference to Chemical Formula 18 below.

represented by Chemical Formula 1 and the third unit represented by Chemical Formula 5, and $R_5$ is substituted for some of H of OH groups of the third unit included in the copolymer. In this case, the first unit and the third unit can be easily radical polymerized.

Although the $F_2$ laser beam is used as the exposing light in Embodiments 1 through 4, the exposing light may be light of a wavelength of a 110 through 180 nm band, such as a $Xe_2$ laser beam, a $Kr_2$ laser beam, an ArKr laser beam and an $Ar_2$ laser beam, a soft X-ray beam of a wavelength of a 1 through Chemical Formula 18:

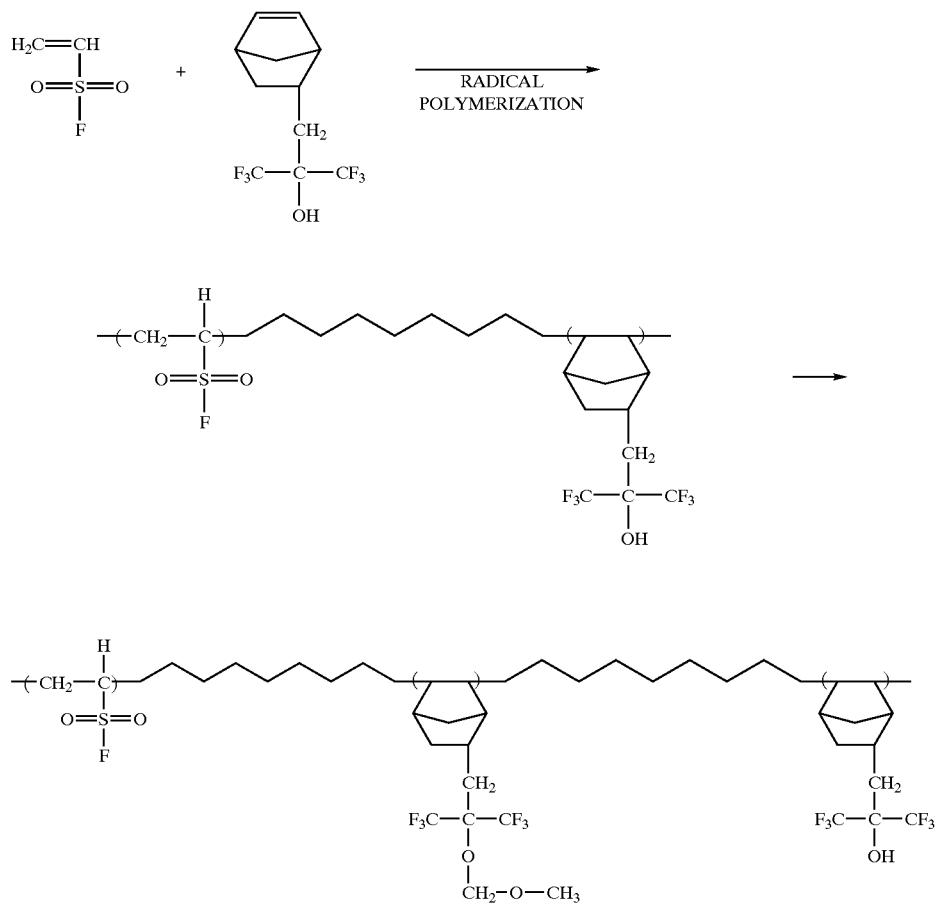

As represented by Chemical Formula 18, a copolymer is obtained through the radical polymerization of the first unit 30 nm band or a hard X-ray beam of a wavelength not longer than a 1 nm band.

What is claimed is:

1. A pattern formation material comprising:

a base polymer including a first unit represented by Chemical Formula 1 and a second unit represented by Chemical Formula 2; and an acid generator:

Chemical Formula 1:

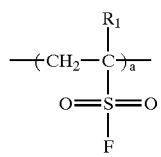

Chemical Formula 2:

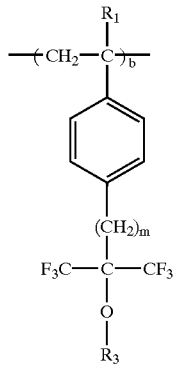

wherein $R_1$ and $R_2$ are the same or different and selected from the group consisting of a hydrogen atom, a chlorine atom, a fluorine atom, an alkyl group and an alkyl group including a fluorine atom; $R_3$ is a protecting group released by an acid; m is an integer of 0 through 5; and a and b satisfy $0<a<1, 0<b<1$ and $0<a+b\leq 1$.

2. The pattern formation material of claim 1, wherein said base polymer is prepared through radical polymerization of said first unit and said second unit.

3. The pattern formation material of claim 1, wherein said base polymer is prepared by obtaining a polymer through radical polymerization of said first unit and a precursor obtained before substituting $R_3$ for said second unit and allowing $R_3$ to bond to said precursor included in said polymer.

4. A pattern formation material comprising:

a base polymer including a first unit represented by Chemical Formula 1, a second unit represented by Chemical Formula 2 and a third unit represented by Chemical Formula 3; and an acid generator:

Chemical Formula 1:

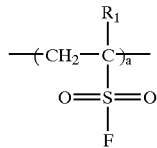

Chemical Formula 2:

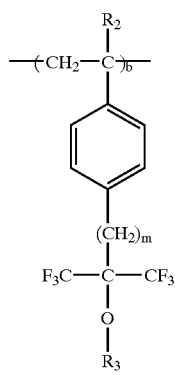

Chemical Formula 3:

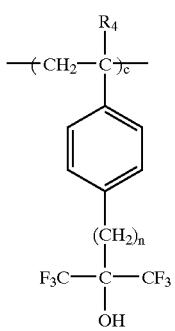

wherein $R_1$, $R_2$ and $R_4$ are the same or different and selected from the group consisting of a hydrogen atom, a chlorine atom, a fluorine atom, an alkyl group and an alkyl group including a fluorine atom; $R_3$ is a protecting group released by an acid; m and n are integers of 0 through 5; and a, b and c satisfy $0<a<1, 0<b<1, 0<c<1$ and $0<a+b+c\leq 1$.

5. The pattern formation material of claim 4, wherein said base polymer is prepared through radical polymerization of said first unit, said second unit and said third unit.

6. The pattern formation material of claim 4, wherein said base polymer is prepared by obtaining a polymer through radical polymerization of said first unit and said third unit and substituting $R_3$ for some of H OH groups of said third unit included in said polymer.

7. A pattern formation material comprising:

a base polymer including a first unit represented by Chemical Formula 1 and a second unit represented by Chemical Formula 4; and an acid generator:

Chemical Formula 1:

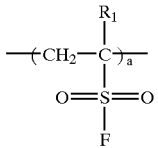

Chemical Formula 4:

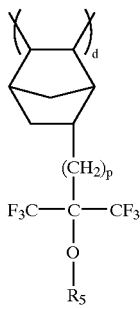

wherein $R_1$ is a hydrogen atom, a chlorine atom, a fluorine atom, an alkyl group or an alkyl group including a fluorine atom; $R_5$ is a protecting group released by an acid; p is an integer of 0 through 5; and a and d satisfy $0<a<1, 0<d<1$ and $0<a+d\leq 1$.

8. The pattern formation material of claim 7, wherein said base polymer is prepared through radical polymerization of said first unit and said second unit.

9. The pattern formation material of claim 7, wherein said base polymer is prepared by obtaining a polymer through radical polymerization of said first unit and a precursor obtained before substituting $R_5$ for said second unit and allowing $R_5$ to bond to said precursor included in said polymer.

10. A pattern formation material comprising:

a base polymer including a first unit represented by Chemical Formula 1, a second unit represented by Chemical Formula 4 and a third unit represented by Chemical Formula 5; and an acid generator:

Chemical Formula 1:

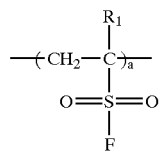

Chemical Formula 4:

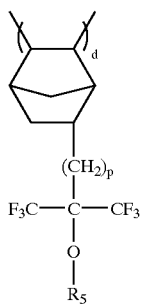

Chemical Formula 5:

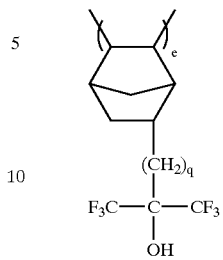

wherein $R_1$ is a hydrogen atom, a chlorine atom, a fluorine atom, an alkyl group or an alkyl group including a fluorine atom; $R_5$ is a protecting group released by an acid; p and q are integers of 0 through 5; and a, d and e satisfy $0<a<1, 0<d<1, 0<e<1$ and $0<a+d+e\leq 1$.

11. The pattern formation material of claim 10, wherein said base polymer is prepared through radical polymerization of said first unit, said second unit and said third unit.

12. The pattern formation material of claim 10, wherein said base polymer is prepared by obtaining a polymer through radical polymerization of said first unit and said third unit and substituting $R_5$ for some of H or OH groups of said third unit included in said polymer.

13. A pattern formation method comprising the steps of:

forming a resist film by applying, on a substrate, a pattern formation material containing a base polymer including a first unit represented by Chemical Formula 1 and a second unit represented by Chemical Formula 2, and an acid generator:

Chemical Formula 1:

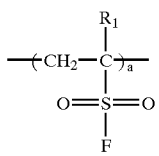

Chemical Formula 2:

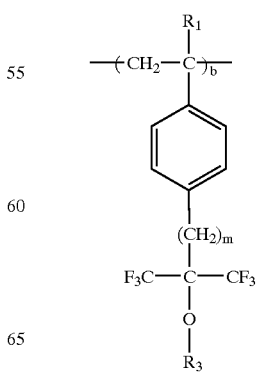

wherein $R_1$ and $R_2$ are the same or different and selected from the group consisting of a hydrogen atom, a chlorine atom, a fluorine atom, an alkyl group and an alkyl group including a fluorine atom; $R_3$ is a protecting group released by an acid; m is an integer of 0 through 5; and a and b satisfy $0<a<1, 0<b<1$ and $0<a+b\leq 1$;

irradiating said resist film with exposing light of a wavelength not longer than a 180 nm band for pattern exposure; and forming a resist pattern by developing said resist film after the pattern exposure.

14. The pattern formation method of claim 13, wherein said exposing light is a $Xe_2$ laser beam, a $F_2$ laser beam, a $Kr_2$ laser beam, an ArKr laser beam or an $Ar_2$ laser beam.

15. The pattern formation method of claim 13, wherein said exposing light is a soft X-ray beam.

16. The pattern formation method of claim 13, wherein said exposing light is a hard X-ray beam.

17. A pattern formation method comprising the steps of:

forming a resist film by applying, on a substrate, a pattern formation material containing a base polymer including a first unit represented by Chemical Formula 1, a second unit represented by Chemical Formula 2 and a third unit represented by Chemical Formula 3, and an acid generator;

Chemical Formula 1:

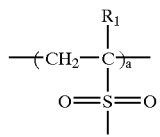

Chemical Formula 2:

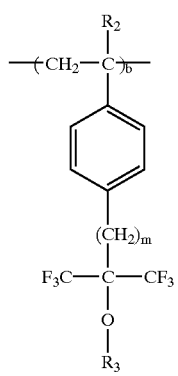

Chemical Formula 3:

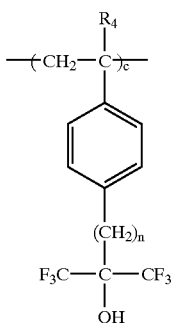

wherein $R_1$, $R_2$ and $R_4$ are the same or different and selected from the group consisting of a hydrogen atom, a chlorine atom, a fluorine atom, an alkyl group and an alkyl group including a fluorine atom; $R_3$ is a protecting group released by an acid; m and n are integers of 0 through 5; and a, b and c satisfy $0<a<1, 0<b<1, 0<c<1$ and $0<a+b+c\leq 1$;

irradiating said resist film with exposing light of a wavelength not longer than a 180 nm band for pattern exposure; and forming a resist pattern by developing said resist film after the pattern exposure.

18. The pattern formation method of claim 17, wherein said exposing light is a $Xe_2$ laser beam, a $F_2$ laser beam, a $Kr_2$ laser beam, an ArKr laser beam or an $Ar_2$ laser beam.

19. The pattern formation method of claim 17, wherein said exposing light is a soft X-ray beam.

20. The pattern formation method of claim 17, wherein said exposing light is a hard X-ray beam.

21. A pattern formation method comprising the steps of:

forming a resist film by applying, on a substrate, a pattern formation material containing a base polymer including a first unit represented by Chemical Formula 1 and a second unit represented by Chemical Formula 4, and an acid generator:

Chemical Formula 1:

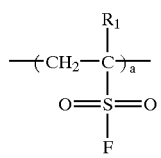

Chemical Formula 4:

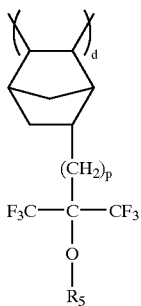

wherein $R_1$ is a hydrogen atom, a chlorine atom, a fluorine atom, an alkyl group or an alkyl group including a fluorine atom; $R_5$ is a protecting group released by an acid; p is an integer of 0 through 5; and a and d satisfy $0<a<1, 0<d<1$ and $0<a+d\leq 1$;

irradiating said resist film with exposing light of a wavelength not longer than a 180 nm band for pattern exposure; and forming a resist pattern by developing said resist film after the pattern exposure.

22. The pattern formation method of claim 21, wherein said exposing light is a $Xe_2$ laser beam, a $F_2$ laser beam, a $Kr_2$ laser beam, an ArKr laser beam or an $Ar_2$ laser beam.

23. The pattern formation method of claim 21, wherein said exposing light is a soft X-ray beam.

24. The pattern formation method of claim 21, wherein said exposing light is a hard X-ray beam.

25. A pattern formation method comprising the steps of:

forming a resist film by applying, on a substrate, a pattern formation material containing a base polymer including a first unit represented by Chemical Formula 1, a second unit represented by Chemical Formula 4 and a third unit represented by Chemical Formula 5, and an acid generator:

Chemical Formula 1:

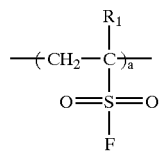

Chemical Formula 4:

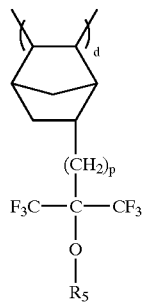

Chemical Formula 5:

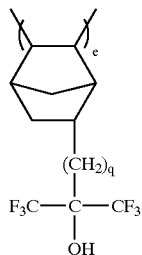

wherein $R_1$ is a hydrogen atom, a chlorine atom, a fluorine atom, an alkyl group or an alkyl group including a fluorine atom; $R_5$ is a protecting group released by an acid; p and q are integers of 0 through 5; and a, d and e satisfy $0<a<1, 0<d<1, 0<e<1$ and $0<a+d+e\leq 1$;

irradiating said resist film with exposing light of a wavelength not longer than a 180 nm band for pattern exposure; and forming a resist pattern by developing said resist film after the pattern exposure.

26. The pattern formation method of claim 25, wherein said exposing light is a $Xe_2$ laser beam, a $F_2$ laser beam, a $Kr_2$ laser beam, an ArKr laser beam or an $Ar_2$ laser beam.

27. The pattern formation method of claim 25, wherein said exposing light is a soft X-ray beam.

28. The pattern formation method of claim 25, wherein said exposing light is a hard X-ray beam.

* * * * *